US011162645B2

(12) United States Patent
Noguchi et al.

(10) Patent No.: US 11,162,645 B2
(45) Date of Patent: *Nov. 2, 2021

(54) LIGHT EMITTING DEVICE INCLUDING HEAT DISSIPATION MEMBER

(71) Applicant: NICHIA CORPORATION, Anan (JP)

(72) Inventors: Teruhiko Noguchi, Anan (JP); Toshio Akita, Anan (JP); Yasuhisa Kotani, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/087,827

(22) Filed: Nov. 3, 2020

(65) Prior Publication Data

US 2021/0071822 A1   Mar. 11, 2021

Related U.S. Application Data

(63) Continuation of application No. 16/860,303, filed on Apr. 28, 2020, now Pat. No. 10,859,216, which is a
(Continued)

(30) Foreign Application Priority Data

Mar. 3, 2017 (JP) .............................. JP2017-040495
Jun. 28, 2017 (JP) .............................. JP2017-125738
Oct. 23, 2017 (JP) .............................. JP2017-204385

(51) Int. Cl.
*F21K 9/64* (2016.01)
*F21V 29/70* (2015.01)
(Continued)

(52) U.S. Cl.
CPC ............ *F21K 9/64* (2016.08); *C09K 11/7706* (2013.01); *F21V 9/00* (2013.01); *F21V 29/70* (2015.01);
(Continued)

(58) Field of Classification Search
CPC ... F21K 9/64; F21V 9/00; F21V 29/70; H01S 5/005; C09K 11/7706
See application file for complete search history.

(56) References Cited

U.S. PATENT DOCUMENTS

2004/0138047 A1    7/2004  Yamada et al.
2011/0096526 A1*   4/2011  Katabe .................. H01L 33/507
                                                      362/84
(Continued)

FOREIGN PATENT DOCUMENTS

JP    2004-217478 A    8/2004
JP    2007-023267 A    2/2007
(Continued)

OTHER PUBLICATIONS

Non-Final Office Action on U.S. Appl. No. 16/860,303 dated May 13, 2020.
(Continued)

*Primary Examiner* — Thomas M Sember
(74) *Attorney, Agent, or Firm* — Foley & Lardner LLP

(57) ABSTRACT

A light emitting device includes: a light transmissive member having an upper face, a lower face, and at least one lateral face; a light reflecting member that surrounds the at least one lateral face of the light transmissive member, the light reflecting member being made of a ceramic that contains a plurality of pores; a heat dissipation member disposed under the light reflecting member and the light transmissive member, the heat dissipation member having light transmissivity; and a light emitting element disposed apart from the heat dissipation member in such a manner as to transmit light from the light emitting element through the heat dissipation member and the light transmissive member.

20 Claims, 11 Drawing Sheets

Related U.S. Application Data continuation of application No. 15/910,921, filed on Mar. 2, 2018, now Pat. No. 10,670,200.

(51) Int. Cl.

| | |
|---|---|
| *F21V 9/00* | (2018.01) |
| *H01S 5/00* | (2006.01) |
| *C09K 11/77* | (2006.01) |
| *H01L 33/60* | (2010.01) |
| *F21Y 115/30* | (2016.01) |
| *H01L 33/58* | (2010.01) |

(52) U.S. Cl.
CPC ............ *F21Y 2115/30* (2016.08); *H01L 33/58* (2013.01); *H01L 33/60* (2013.01); *H01L 2933/0041* (2013.01); *H01S 5/0087* (2021.01)

(56) References Cited

U.S. PATENT DOCUMENTS

| | | |
|---|---|---|
| 2011/0210658 A1 | 9/2011 | Pan et al. |
| 2012/0068213 A1 | 3/2012 | Zhang et al. |
| 2013/0242565 A1 | 9/2013 | Arai et al. |
| 2013/0250544 A1 | 9/2013 | Zink et al. |
| 2015/0247618 A1 | 9/2015 | Irie |
| 2015/0292687 A1 | 10/2015 | Sugiyama |
| 2017/0023188 A1 | 1/2017 | Mima et al. |

FOREIGN PATENT DOCUMENTS

| | | |
|---|---|---|
| JP | 2007-039303 A | 2/2007 |
| JP | 2013-518797 A | 5/2013 |
| JP | 2013-543525 A | 12/2013 |
| JP | 2015-019013 A | 1/2015 |
| JP | 2016-018878 A | 2/2016 |
| JP | 2016-138034 A | 8/2016 |

OTHER PUBLICATIONS

Notice of Allowance on U.S. Appl. No. 15/910,921 dated Jan. 30, 2020.

Notice of Allowance on U.S. Appl. No. 16/860,303 dated Aug. 26, 2020.

\* cited by examiner

LIGHT EMITTING DEVICE INCLUDING HEAT DISSIPATION MEMBER

CROSS-REFERENCE TO RELATED APPLICATIONS

The present application is a continuation of U.S. patent application Ser. No. 16/860,303, filed on Apr. 28, 2020, which is a continuation of U.S. patent application Ser. No. 15/910,921, filed on Mar. 2, 2018, now U.S. Pat. No. 10,670,200, which claims priority to Japanese Patent Application No. 2017-040495, filed on Mar. 3, 2017, Japanese Patent Application No. 2017-125738, filed on Jun. 28, 2017, and Japanese Patent Application No. 2017-204385, filed on Oct. 23, 2017, the disclosures of which are hereby incorporated by reference in their entireties.

BACKGROUND

The present disclosure relates to an optical component and a method of manufacturing an optical component.

The optical component disclosed in Japanese Patent Publication No. 2015-019013 includes a light transmissive member fixed on the light extraction member made of alumina or the like via a metal film, as shown, for example, in FIG. 2 of Japanese Patent Publication No. 2015-019013.

SUMMARY

In such an optical component, the luminance is likely to decline as the metal film degrades.

The optical component related to a certain embodiment of the present disclosure includes a light transmissive member, which has an upper face, a lower face, and at least one lateral face, and a light reflecting member, which is disposed at the at least one lateral face of the light transmissive member in such a manner as to surround the light transmissive member. The light reflecting member is made of a ceramic including a plurality of pores therein, and the plurality of pores are localized in the vicinity of the light transmissive member in a cross section cutting across the light transmissive member and the light reflecting member.

The method of manufacturing an optical component related to certain embodiment of the present disclosure includes: providing a light transmissive member which has an upper face, a lower face, and at least one lateral face; forming a molded body which contains light reflecting powder made of an inorganic material at the at least one lateral face of the light transmissive member in such a manner as to surround the light transmissive member; and sintering the molded body such that the light reflecting member including a sintered body of the light reflecting powder is integrally formed with the light transmissive member while a plurality of pores in the light reflecting member are localized in the vicinity of the light transmissive member in a cross section cutting across the light transmissive member and the light reflecting member.

According to the optical component described above, the luminance decline can be attenuated while ensuring a certain degree of the strength of the optical component.

According to the method of manufacturing an optical component described above, an optical component having an attenuated luminance decline and ensured a certain degree of the strength can be manufactured in a simplified manner.

DETAILED DESCRIPTION

Certain embodiments for implementing the present disclosure will be explained below with reference to the drawings. However, the embodiments described below are intended as illustrative to give concrete form to the technical idea of the present invention, and not intended to limit the present invention. The sizes of and the positional relationship between the members shown in each drawing might be exaggerated for clarity of explanation.

First Embodiment

Figure 1A:
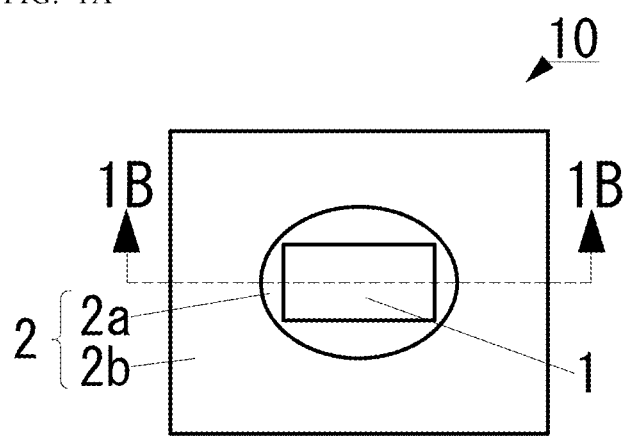
FIG. 1A is a top view of the optical component related to the first embodiment.
Figure 1B:
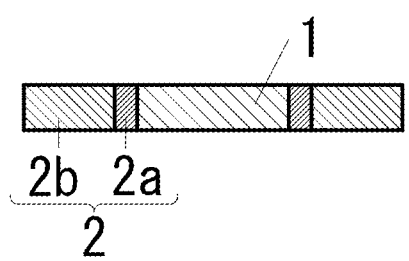
FIG. 1B is a cross-sectional view taken along line 1B-1B in FIG. 1A.

FIG. 1A is a top view of the optical component 10 related to the first embodiment. FIG. 1B is a cross-sectional view taken along line 1B-1B in FIG. 1A.

The optical component 10 includes a light transmissive member 1 that has an upper face, a lower face, and at least one lateral face, and a light reflecting member 2 disposed at the at least one lateral face side of the light transmissive member 1 in such a manner as to surround the light transmissive member 1. The light reflecting member 2 is made of a ceramic containing a plurality of pores, and the pores are localized in the vicinity of the light transmissive member 1 in a cross section that extends through the light transmissive member 1 and the light reflecting member 2.

According to the optical component 10, the transmittance of the light reflecting member 2 can be reduced, and a certain degree of the strength of the optical component 10 can be ensured. This will be explained below.

In a conventional optical component, a metal film is disposed between the light transmissive member and the light extraction member, and the light traveling from the light transmissive member towards the light extraction member is reflected by the metal film to be extracted. However, in the case of automotive applications, for example, the metal film can be degraded by salt damage or the like in the automobiles that are used or placed in coastal regions. In such a case, the light extraction efficiency declines.

Accordingly, one way to address this is to dispose a light reflecting member made of ceramic so as to surround the light transmissive member instead of employing a metal film. In this case, in order to reduce the transmission and efficiently reflect the light traveling from the light transmissive member towards the light reflecting member, the porosity of the light reflecting member can be increased. Increasing the porosity across the board, however, can lead to reduction in the strength of the light reflecting member.

Accordingly, the present inventors employ a ceramic for the light reflecting member 2 in which pores are localized in the vicinity of the light transmissive member 1 in a cross section that extends through the light transmissive member 1 and the light reflecting member 2. In other words, the ceramic used as the light reflecting member 2 has a first region 2a having first porosity and a second region 2b having second porosity that is lower than the first porosity successively from the light transmissive member side.

In this manner, the transmission of the light from the light transmissive member 1 can be reduced by the first region 2a while allowing the second region 2b to ensure the strength of the optical component 10. Accordingly, an optical component 10 having a luminance decline attenuated and a strength ensured to a certain degree can be produced.

The constituent elements of the optical component 10 will be explained below.

Light Transmissive Member 1

The light transmissive member 1 is made of a material that transmits the light from a light emitting element or the like. For the light transmissive member 1, a material can be used that does not melt at the sintering temperature of the light reflecting member 2. In this embodiment, a ceramic containing a phosphor (hereinafter referred to as a "phosphor ceramic") is employed as the light transmissive member 1.

Light readily scatters inside a phosphor ceramic, thus light readily hits the light reflecting member 2. This makes the light transmission reducing effect of the first region 2a more significant. In the light reflecting member 2, the second region 2b, which has lower porosity than the first region 2a, has good heat dissipation characteristics.

Accordingly, the heat generated by the phosphor can be efficiently dissipated by the second region 2b via the first region 2a. Although a phosphor ceramic is used as the light transmissive member 1 here, a single crystal phosphor may alternatively be used. Even in this case, the heat from the phosphor can be efficiently dissipated to the second region 2b of the light reflecting member 2 according to the present embodiment.

Although another light transmissive member may be interposed between the light transmissive member 1 and the light reflecting member 2, the light transmissive member 1 in this embodiment is disposed to be in contact with the at least one lateral face of the light reflecting member 2. In other words, the light transmissive member 1 and the light reflecting member 2 are in direct contact with one another without anything interposed therebetween.

The absence of a material that can absorb light increases the light extraction efficiency. In the case in which the light transmissive member 1 contains a phosphor, moreover, the heat generated by the phosphor can be more easily dissipated as compared to the case of interposing another member.

In this embodiment, a material is used for the phosphor ceramic that contains a phosphor and a binder made of an inorganic material. Specifically, a YAG (yttrium aluminum garnet)-based phosphor is employed for the phosphor, and aluminum oxide is used for the binder. For the light reflecting member 2, moreover, a material containing aluminum oxide as a primary component is employed. In such a case in which the binder in the light transmissive member 1 contains the same material as that contained in the light reflecting member 2, the adhesion between the light transmissive member 1 and the light reflecting member 2 can be increased.

It is preferable to employ a phosphor having a coefficient of linear expansion that is close to the coefficient of linear expansion of the light reflecting member 2 in order to enhance the adhesion between the light transmissive member 1 and the light reflecting member 2.

In the case of employing a material containing aluminum oxide as a primary component of the light reflecting member 2, YAG-based phosphors can be employed as an example of phosphor having a similar coefficient of linear expansion.

YAG-based phosphors include, for example, those in which at least a portion of Y is substituted with Tb or Lu. Furthermore, YAG-based phosphors may be those having a composition that contains Gd, Ga, or the like.

In the case of employing a YAG-based phosphor for the phosphor and aluminum oxide for the light reflecting member 2, for the same reason, the binder contained in the light transmissive member 1 is preferably aluminum oxide.

For the binder, for example, YAG not containing any activator or yttrium oxide can also be used. Including a binder allows for the adjustment of the phosphor content, which facilitates the adjustment of the color of the light released from the light transmissive member 1.

In addition, sapphire, light transmissive alumina, or quartz, which do not substantially contain phosphors, can be used for the light transmissive member 1. Even in the case where substantially no phosphor is included in the light transmissive member 1, the light scattered in the light transmissive member 1 can be efficiently reflected by the first region 2a of the light reflecting member 2, and the strength of the optical component 10 can be easily ensured to a certain degree by the second region 2b of the light reflecting member 2.

In this embodiment, the light transmissive member 1 is a rectangular prism, and the upper face thereof is a rectangle that is elongated in one direction. The light transmissive member can have other shapes, such as a cylinder, polygonal prism, truncated pyramid, or truncated cone, and among all, a cylinder or truncated cone is preferable. A cylinder or truncated cone can reduce unevenness of light emission because the width of the first region 2a (the length of the portion of a straight line passing through the center of the circular light transmissive member 1 overlapping the first region 2a when viewed from the upper face side) can be closely brought to a constant width.

Light Reflecting Member 2

The light reflecting member 2 is disposed at the at least one lateral face of the light transmissive member 1 in such a manner as to surround the light transmissive member 1 when viewed from the upper face side. In other words, a through hole is provided to penetrate the light reflecting member 2 in an up/down direction, and the light transmissive member 1 is disposed in the through hole. The upper face of the light transmissive member 1 and the lower face of the light transmissive member 1 are exposed from the light reflecting member 2. In this embodiment, the light reflecting member 2 is disposed at all of the lateral faces of the light transmissive member 1 in such a manner as to surround the light transmissive member 1.

The light reflecting member 2 is made of a ceramic that contains a plurality of pores. In a cross section that extends through the light transmissive member 1 and the light reflecting member 2, the pores are localized in the vicinity of the light transmissive member 1. That is, the light reflecting member has a first region 2a having first porosity and a second region 2b having second porosity successively from the light transmissive member side.

If the porosity of the entire light reflecting member is reduced, the transmittance would increase even though the strength is enhanced. This is because of the reduced number of interfaces created by the pores in the light reflecting member 2, which facilitates the propagation of the light entering the light reflecting member 2.

If the porosity of the entire light reflecting member is increased, on the other hand, the transmittance would decline, but the strength would be reduced.

In contrast, the optical component according to the present embodiment can efficiently reflect light in the vicinity of the light transmissive member 1 by providing the first region 2a having relatively high porosity in contact with the light transmissive member 1.

Furthermore, both the strength and the heat dissipation performance are enhanced by providing the second region 2b having relatively low porosity on the outside of the first region 2a.

The first region 2a and the second region 2b herein exist within the same member and have the same composition. That is, two different members bonded together do not constitute the first region 2a and the second region 2b herein. This can make it difficult for the separation between the first region 2a and the second region 2b to occur as compared to the case where two different members are bonded together.

Along the entire perimeter of the light transmissive member 1, the width of the first region 2a (the length of the portion of a straight line passing through the center of optical component 10 overlapping the first region 2a when viewed from the upper face side) is preferably smaller than the width of the second region 2b (the length of the portion of a straight line passing through the center of optical component 10 overlapping the second region 2b when viewed from the upper face side). This can more easily ensure the strength of the light reflecting member 2.

The width of the first region 2a is preferably set in the range of from 50 μm to 300 μm, more preferably from 100 μm to 250 μm.

Setting the width in the range of 50 μm or larger can readily attenuate the transmission of the light traveling towards the light reflecting member 2.

Moreover, setting the width in the range of not more than 300 μm can facilitate the dissipation of the heat from the phosphor in the case of using a member containing a phosphor as the light transmissive member 1 because the distance can be reduced to the second region 2b, which has low porosity and enhanced heat dissipation characteristics.

Although a width for the first region 2a along the entire perimeter of the light transmissive member 1 is preferably constant, the distance may vary as in the case of the present embodiment. An example is assumed in which both outer shapes of the light transmissive member 1 and the light reflecting member 2 are rectangular, the centers of the two coincide, and their respective sides are in parallel, when viewed from the upper face side of the optical component 10. Here, it is assumed that the distance of the portion in which the straight line passing through the center of the light transmissive member 1 perpendicular to one constituent side of the light transmissive member 1 (hereinafter referred to as "L1") overlapping the first region 2a is "D1a," the length of the portion of L1 overlapping the second region 2b is "D1b,"

the length of the portion of the straight line through the center of the light transmissive member 1 perpendicular to L1 (hereinafter referred to as "L2") overlapping the first region 2a is "D2a," and the length of the portion of L2 overlapping the second region 2b is "D2b."

In this case, for example, if D1a is larger than D2a, D1b is preferably set larger than D2b. Although providing the first region 2a with a large width facilitates the reflection of light by the first region 2a, it readily reduces the strength. However, even in such a case, increasing the width of the second region 2b located near the large-width first region 2a can attenuate the strength decline of the optical component 10.

As shown in FIG. 1B, the first region 2a is preferably disposed from the upper end to the lower end of all of the lateral face of the light transmissive member 1. This can reduce the transmission of light across the entire area of each lateral face of the light transmissive member 1.

Zirconium oxide, titanium oxide, or the like, for example, can be used for the light reflecting member 2 instead of aluminum oxide. The light reflecting member 2 may contain an additive made of a material that is different from the primary component.

Examples of additives include yttrium oxide, zirconium oxide, boron nitride, lutetium oxide, and lanthanum oxide. These materials can reduce the transmittance of the light reflecting member 2.

As described above, the first region 2a has high porosity and the second region 2b has low porosity. For example, as will be explained later with reference to an example of the present disclosure, the high-porosity region (i.e., first region) and the low-porosity region (i.e., second region) can be distinguished by using an incident light microscope in dark-field observation. In addition, porosity differences can be found by observing the light reflecting member 2 using a scanning electron microscope (SEM). "A plurality of pores are localized in the vicinity of the light transmissive member 1" here refers to the pore density in the region between the surface of the light transmissive member 1 and the lines 300 μm away from the surface of the light reflecting member 2 being higher than the pore density of the outer region located outside the lines 300 μm on the light reflecting member 2 when observing by using, for example, a scanning electron microscope.

Others

In the case in which a material containing a phosphor is used as the light transmissive member 1, a heat dissipation member 3 having light transmissivity is preferably disposed on at least one of the following: the upper face of the light transmissive member 1, the upper face of the light reflecting member 2, the lower face of the light transmissive member 1, and the lower face of the light reflecting member 2.

Although the heat dissipation performance of the first region 2a might be low because of the high porosity, providing a heat dissipation member 3 can dissipate the heat generated at the light transmissive member 1, thereby improving the temperature characteristics of the light transmissive member 1. The heat dissipation member 3 is preferably disposed directly on at least one of the light transmissive member 1 or the light reflecting member 2.

In the case in which a filter 4 is provided on the heat dissipation member 3 to reflect the light traveling from the light transmissive member 1 towards the heat dissipation member 3, however, the heat dissipation member may be indirectly disposed on at least one of the light transmissive member 1 or the light reflecting member 2 via the filter 4.

Next, a method of manufacturing the optical component 10 will be explained with reference to FIG. 2A to FIG. 7B.

The method of manufacturing the optical component 10 includes; providing a light transmissive member 1 that has an upper face, a lower face, and at least one lateral face; forming a molded body 2d containing light reflecting powder made of an inorganic material at the at least one lateral face of the light transmissive member 1 in such a manner as to surround the light transmissive member 1; and sintering the molded body 2d such that a light reflecting member including a sintered body of the light reflecting powder is integrally formed with the light transmissive member while a plurality of pores in the light reflecting member 2 are localized in the vicinity of the light transmissive member 1 in a cross section that extends through the light transmissive member 1 and the light reflecting member 2.

In this manner, an optical component 10 with an attenuated luminance decline and easily ensured strength to a certain degree can be manufactured in a simplified manner.

The method of manufacturing an optical component 10 will be explained below. The same designations and reference numerals represent the same members or those of similar quality explained in the foregoing, redundant explanations for which will thus be omitted when appropriate.

Preparing Light Transmissive Member 1

First, a light transmissive member 1 having an upper face, a lower face, and at least one lateral face is provided. In this embodiment, the light transmissive member 1 having a plurality of lateral faces is prepared. In this embodiment, multiple light transmissive members 1 are prepared. This can produce multiple optical components 10 each having a light transmissive member 1 in a single sintering operation, thereby increasing production efficiency.

Temporarily securing Light Transmissive Member 1 on Support Member 40

Figure 2A:
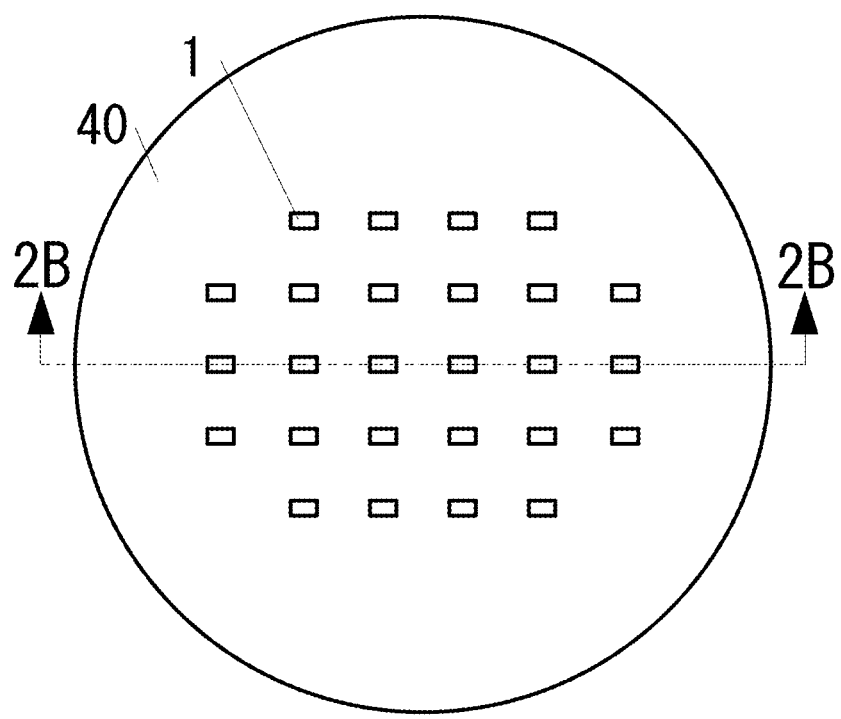
FIG. 2A is a view illustrating the method of manufacturing an optical component related to the first embodiment.
Figure 2B:
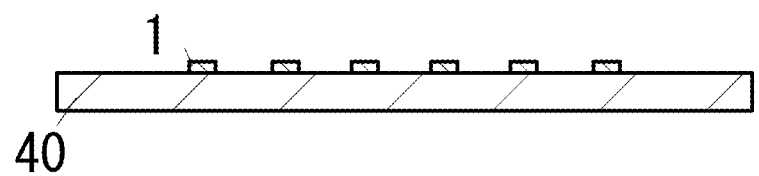
FIG. 2B is a cross-sectional view taken along line 2B-2B in FIG. 2A.

Next, as shown in FIGS. 2A and 2B, the light transmissive members 1 are temporarily secured on a support member 40. This can reduce the instances of allowing the light transmissive members 1 to tip over in the step of forming a molded body 2d that contains light reflecting powder. This, moreover, can maintain a constant distance between adjacent light transmissive members 1. In this embodiment, a resin is disposed only between the light transmissive members 1 and the support member 40 in order to temporarily secure the light transmissive members 1 on the support member 40. This facilitates the removal of the support member 40 without applying an excessive force in the step of removing the support member 40 from the light transmissive members 1 and the molded body 2d. Considering the ease of operation, the use of a support member 40 is preferable, but is not necessarily required.

The material for the support member 40 can be selected in accordance with the method employed in the step of forming the molded body 2d. In this embodiment, since the molded body 2d is formed by a slip casting process (i.e., slurry cast molding), plaster is used for the support member 40.

In the case of employing a slip casting process for forming a molded body 2d, applying an adhesive across the entire upper face of the plaster may cause the plaster to unevenly absorb the moisture contained in the slurry to thereby cause cracks to occur.

Accordingly, uneven moisture absorption is controlled by applying the resin only between the light transmissive members 1 and the support member 40 here. For the resin, for example, an acrylic-based resin can be used. This can reduce the probabilities that the components of the resin are mixed into the slurry as a result of the reaction between the binder contained in the slurry and the resin.

The light transmissive members 1 are temporarily secured on the upper face of the support member 40 at predetermined intervals. The distance from a lateral face of a light transmissive member 1 to the lateral face of an adjacent light transmissive member 1 can be set, for example, in the range of from 1 mm to 10 mm. Setting the distance to 1 mm or larger can secure a certain width for the second region 2b. Setting the distance to 10 mm at most can increase the number of the light transmissive members 1 respectively included in optical components that can be produced in a single sintering operation.

Forming Molded Body 2d Containing Light Reflecting Powder

Subsequently, as shown in FIG. 3A, FIG. 3B, FIG. 4A and FIG. 4B, the molded body 2d containing light reflecting powder made of an inorganic material is formed at the at least one lateral face of the light transmissive members 1 in such a manner as to surround the light transmissive member. In this embodiment, the molded body 2d is formed on the at least one lateral face of each light transmissive member 1 in such a manner as to surround each of the light transmissive members 1.

The molded body 2d can be formed by a slip casting process, a doctor blade (sheet forming) process, or a dry molding process. In the case of employing a doctor blade process, specifically, a molded body can be formed by applying a slurry containing an additive in a sheet shape in such a manner as to cover the light transmissive members, followed by drying the green sheet which is the sheet-shaped slurry coating.

In the case of employing a dry molding process, a molded body can be formed by filling a container with light reflecting powder made of an inorganic material in such a manner as to cover the light transmissive members, followed by pressing the light reflecting powder.

Figure 3A:
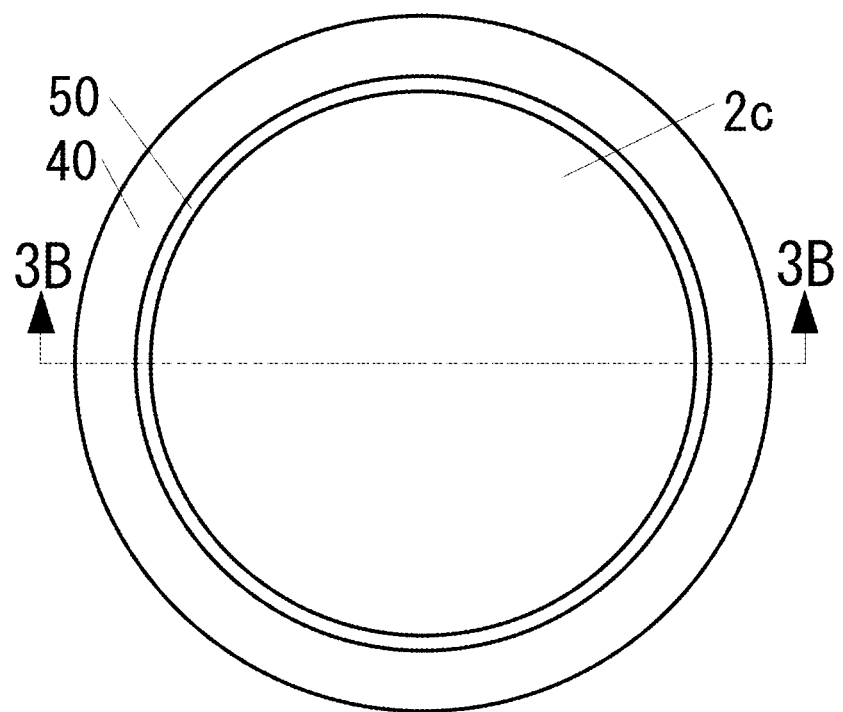
FIG. 3A is a view illustrating the method of manufacturing an optical component related to the first embodiment.
Figure 3B:
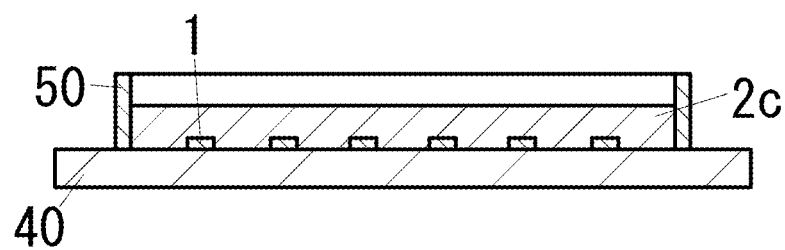
FIG. 3B is a cross-sectional view taken along line 3B-3B in FIG. 3A.

In this embodiment, the molded body 2d is formed by a slip casting process. Specifically, as shown in FIG. 3A and FIG. 3B, a frame 50 which surrounds multiple light transmissive members 1 is arranged on the upper face of the support member 40. Then, a slurry 2c containing light reflecting powder is poured into the frame 50. Then, the plaster is allowed to absorb the moisture contained in the slurry 2c. Plaster is a moisture absorbing material, therefore it can be left standing, for example, for a few hours at room temperature to allow the plaster to absorb moisture. This forms the molded body 2d containing the light reflecting powder. Although not completely adhered together at this time, the light transmissive members 1 and the molded body 2d are molded into a certain shape (hereinafter the light transmissive members 1 and the molded body 2d formed into a certain shape is referred to as a "complex").

With the slip casting process, forming can be performed without applying pressure or pressing. Moreover, the number of organic substances contained in the slurry can be reduced as compared to a doctor blade process. This can increase the density of the molded body, thereby reducing the probabilities of crack formation in the light reflecting member 2 during sintering.

For the frame 50, one that is releasable and water repellent can be used. This can reduce the probabilities of the molded body 2d adhering to the interior lateral faces of the frame 50. This can also reduce the absorption of the moisture contained in the slurry 2c by the frame 50, thereby reducing uneven density of the molded body in the molded body 2d in the vicinity of the frame 50. In this embodiment, a frame 50 made of a fluorine resin is used.

The slurry 2c in this embodiment contains light reflecting powder composed of aluminum oxide and yttrium oxide, dispersing agent, a binder, and pure water. The thickness of the slurry 2c is preferably larger than the thickness of the light transmissive members 1. That is, the slurry 2c preferably covers not only the lateral faces, but also the upper face of each light transmissive member 1. It is difficult to match the thickness of the slurry to that of the light transmissive members, thus the thickness of the light transmissive members occasionally becomes larger. In this case, the light transmissive members will likely be damaged because the mechanical force applied during polishing or the like is applied only to the light transmissive members in the step of partially removing the optical component 10 described later.

Accordingly, in this embodiment, the thickness of the slurry is increased to alleviate the force from being applied only to the light transmissive members 1. The thickness of the slurry 2c is preferably two to four times the thickness of the light transmissive member 1. Setting the thickness to at least twice makes it more difficult for the light transmissive member 1 to separate from the molded body 2d, thereby facilitating the removal of the support member 40 from the light transmissive members 1 and the molded body 2d. Furthermore, setting the thickness to four times at most can reduce the thickness of the optical components 10 that will be removed in the step of partially removing the resulting optical component 10.

Step of Removing Support Member 40

Figure 4A:
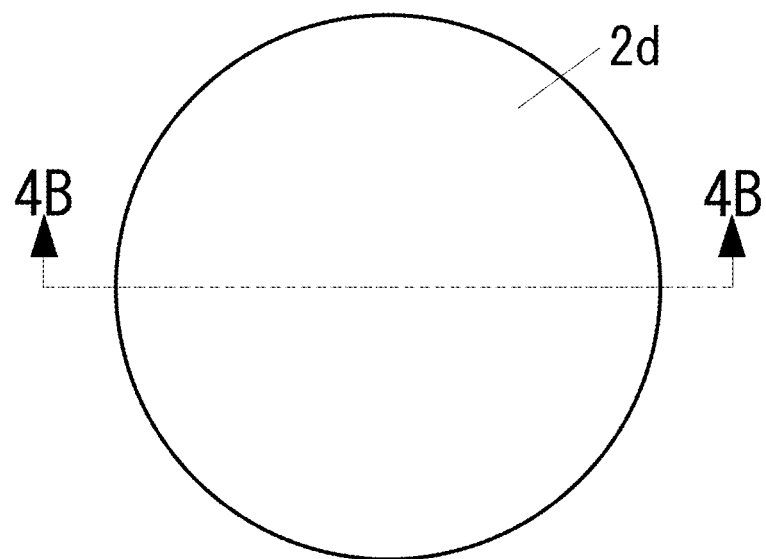
FIG. 4A is a view illustrating the method of manufacturing an optical component related to the first embodiment.
Figure 4B:
FIG. 4B is a cross-sectional view taken along line 4B-4B in FIG. 4A.

Subsequently, as shown in FIG. 4A and FIG. 4B, the support member 40 is removed from the light transmissive members 1 and the molded body 2d. The light transmissive members 1 is temporarily secured to the support member 40 using a resin, but the area of the lower surface of each light transmissive member 1 is relatively small. The light transmissive members 1 and the molded body 2d are integrally formed to some extent. For these reasons, the support member 40 can be separated from the light transmissive members 1 without softening the resin by heating, or pulling by applying an excessive force. In this embodiment, the complex is removed from the support member 40 after removing the frame 50 from the upper face of the support member 40.

Degreasing Step

Subsequently, in order to remove the organic substances (e.g., dispersing agent and binder) contained in the complex, the complex is heated at a lower temperature than the temperature for sintering the molded body 2d.

The degreasing step can be performed in, for example, nitrogen ambiance or ambient air. The heating for degreasing purposes is preferably performed for at least three hours in order to remove the organic substances with certainty.

In this embodiment, the degreasing step is performed separately from the step of sintering the molded body 2d. However, degassing may be performed in the step of sintering the molded body 2d by heating at low temperature for a certain period followed by raising the temperature to sinter the molded body 2d. This step is unnecessary in the case of employing a dry molding process in the step of forming a molded body 2d.

Sintering Molded Body 2d

Subsequently, the molded body 2d is sintered such that the light reflecting member including a sintered body of the light reflecting powder is integrally formed with the light transmissive member while a plurality of pores in the light reflecting member 2 are localized in the vicinity of the light transmissive member 1 in a cross section that extends through the light transmissive member 1 and the light reflecting member 2.

Such a light reflecting member 2 can be produced by adjusting the sintering temperature and the pressure applied during sintering.

Figure 5A:
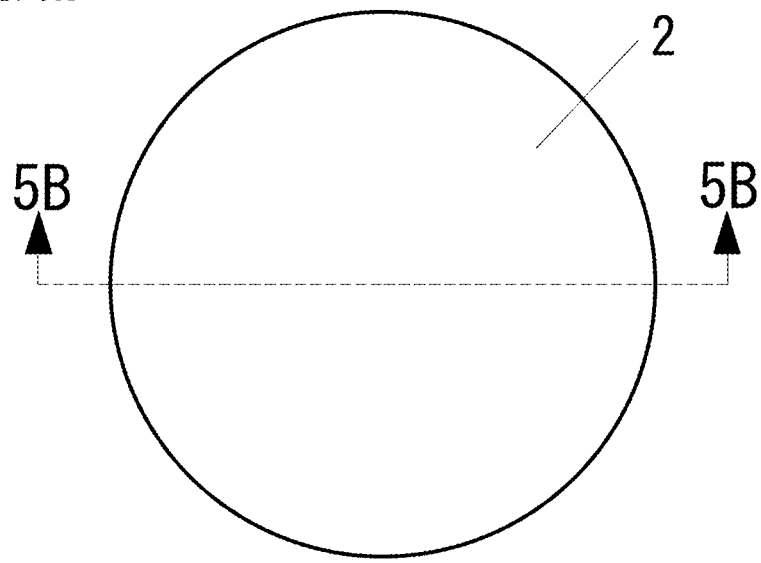
FIG. 5A is a view illustrating the method of manufacturing an optical component related to the first embodiment.
Figure 5B:
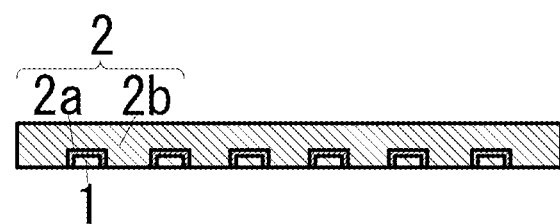
FIG. 5B is a cross-sectional view taken along line 5B-5B in FIG. 5A.

As shown in FIG. 5A and FIG. 5B, by sintering without pressing the molded body 2d, an optical component 10 is produced in which the sintered body of the light reflecting powder and the light transmissive members 1 are integrated.

This can provide an optical component 10 having a first region 2a and a second region 2b successively from the light transmissive member side. The first region 2a and the second region 2b are believed to be formed for the reasons described below. When sintering the molded body 2d, the light reflecting powder contracts while neighboring powder particles are fused together.

At this time, neighboring powder particles are present along the entire circumference of a particle in the areas distant from the light transmissive members 1, thus they readily fuse together making it difficult for pores to form.

In the areas near the light transmissive members 1, on the other hand, neighboring particles are present only on the outer side, thus it is difficult for the light reflecting powder particles to fuse together, allowing for pores to be formed.

It is believed that the porosity of light reflecting member 2 is higher in the vicinity of the light transmissive member 1 because sintering without pressuring the molded body allows the sintering to complete while maintaining the state in which the light reflecting powder particles are separated.

Figure 8A:
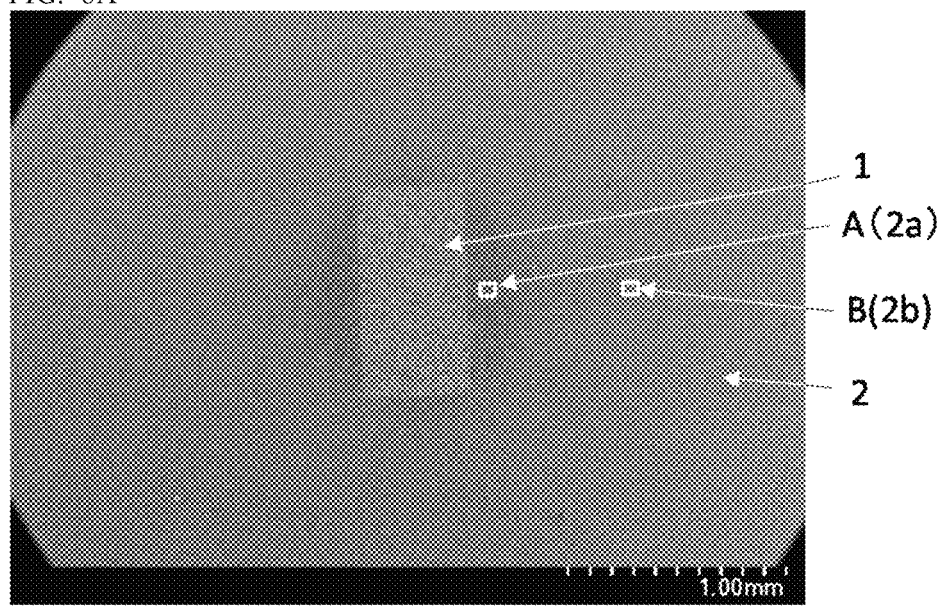
FIG. 8A is a secondary electron image observing from the upper face side of an optical component.

FIG. 8A is a secondary electron image of the optical component 10, observed from the upper face side, in which a molded body 2d having light reflecting powder containing 95.2 wt % aluminum oxide and 4.8 wt % yttrium oxide is formed on the periphery of a phosphor-containing ceramic light transmissive member 1 by slip casting, and subsequently sintering without applying pressure.

Figure 8B:
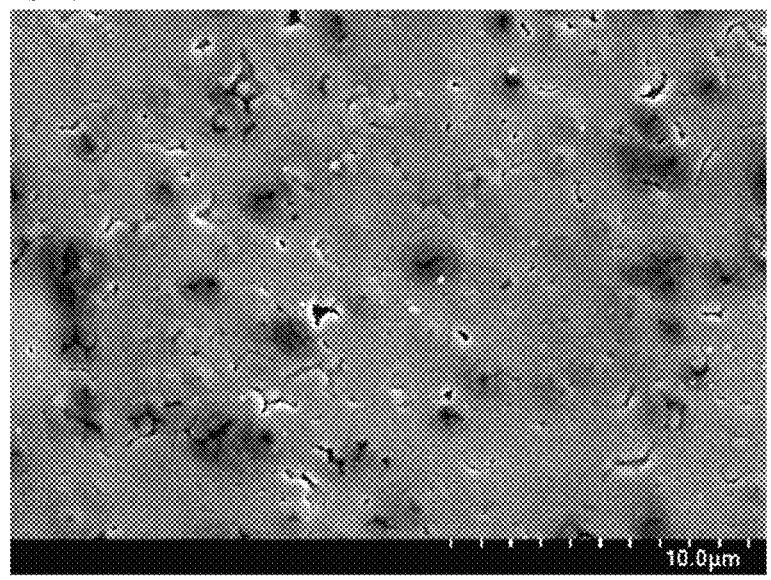
FIG. 8B is a SEM image of the region A in FIG. 8A.
Figure 8C:
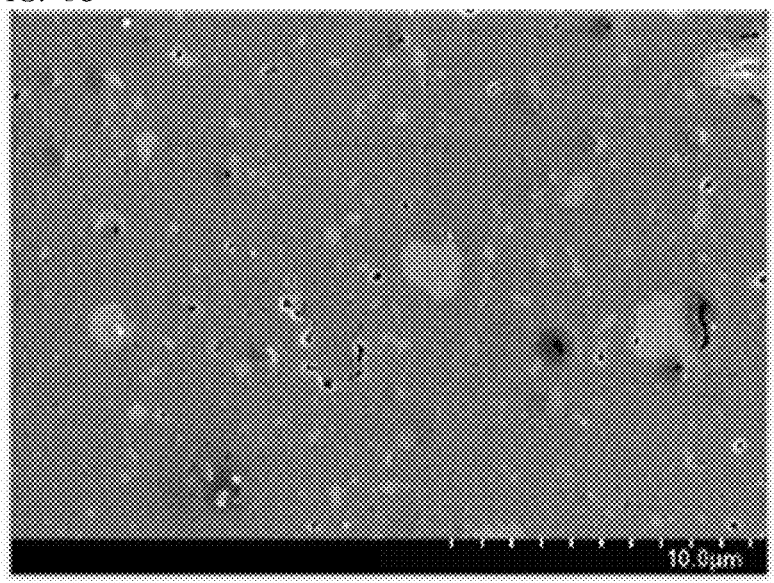
FIG. 8C is a SEM image of the region B in FIG. 8A.

In measuring the secondary electron image, a carbon film was formed by vapor deposition for the purpose of measuring the secondary electron image. The first region 2a in FIG. 8A appears darker than the second region 2b attributable to the pores contained in the first region 2a. FIG. 8B is a SEM image of the region A in FIG. 8A, and FIG. 8C is a SEM image of the region B in FIG. 8A. In FIG. 8B, which shows the region in the vicinity of the light transmissive member 1, a large number of pores are present, whereas in FIG. 8C, the pores are almost nonexistent. As shown by these results, it was confirmed that forming the light reflecting member 2 by sintering the light reflecting powder without pressure can achieve the light reflecting member 2 that has regions of different porosities.

In the case of employing aluminum oxide for the light reflecting powder, the sintering temperature is preferably set to from 1200° C. to 1800° C., more preferably from 1400° C. to 1500° C. By setting it to at least 1200° C., the strength of the material serving as the light reflecting member 2 can be ensured. Furthermore, setting the sintering temperature to 1800° C. at most reduces the chances of producing a light reflecting member 2 with a high transmittance.

In this embodiment, the sintering is performed in ambient air. The sintering time is preferably set, for example, to in the range of from 30 minutes to 5 hours, more preferably from 2 hours to 4 hours. Setting the sintering time to at least 30 minutes readily ensures the strength of the light reflecting member 2. Setting the sintering time to 5 hours at most can avoid sintering for more time than necessary.

Partially Removing Optical Component 10

Figure 6A:
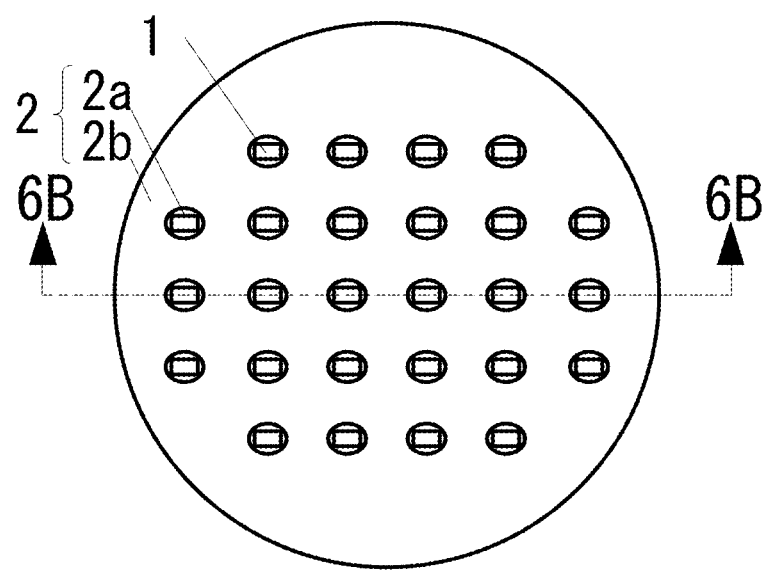
FIG. 6A is a view illustrating the method of manufacturing an optical component related to the first embodiment.
Figure 6B:
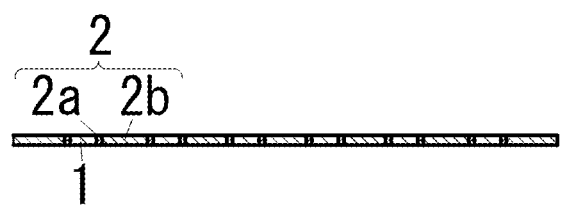
FIG. 6B is a cross-sectional view taken along line 6B-6B in FIG. 6A.

At this stage, the upper face of the light transmissive member 1 is covered with the light reflecting member 2. Accordingly, as shown in FIG. 6A and FIG. 6B, a portion of the optical component 10 is removed from the upper face side of the optical component 10 until the light transmissive member 1 is exposed. Examples of the methods for partially removing the optical component 10 include polishing or the like. In this embodiment, the optical component 10 is partially removed only from one side. However, in order to remove extraneous matter on the lower face of the light transmissive member and the lower face of the light reflecting member 2, a portion of the optical component 10 may further be removed from the lower face side of the optical component 10. In this embodiment, the light transmissive member 1 is a polygonal prism, and the portions of the light reflecting member that are in contact with the corners have no first region 2a, or the width of the first region 2a in the areas in contact with the corners is narrower than the first region 2a in other areas when viewed from the top.

This step is not necessarily a requirement, and may be omitted if, for example, the optical component has been obtained with a light transmissive member 1 with exposed upper face in the step of sintering the molded body 2d.

Dividing into Individual Pieces

Figure 7A:
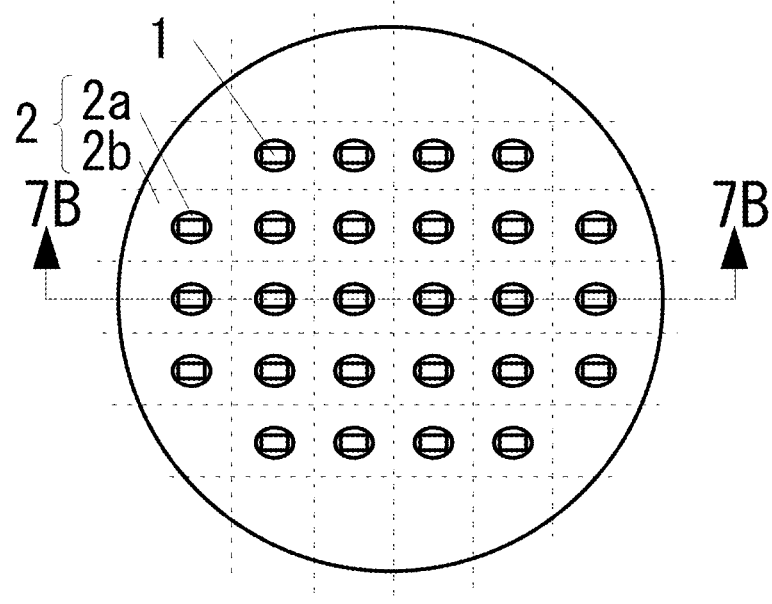
FIG. 7A is a view illustrating the method of manufacturing an optical component related to the first embodiment.
Figure 7B:
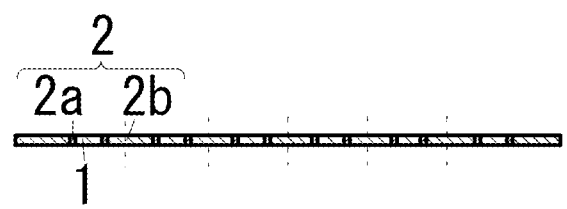
FIG. 7B is a cross-sectional view taken along line 7B-7B in FIG. 7A.

Subsequently, as shown in FIG. 7A and FIG. 7B, the complex is divided into multiple optical components 10 each having a light transmissive member 1. For example, a blade can be used to divide the complex into multiple optical components 10. Although the complex is divided into pieces such that each optical component 10 has a single light transmissive member 1 in this embodiment, it can be divided such that each optical component 10 includes multiple light transmissive members 1. Moreover, this step is not necessarily a requirement, and may be omitted if, for example, a given optical component 10 has been obtained in the step of sintering the molded body 2d or the step of partially removing the optical component 10.

Second Embodiment

Figure 9:
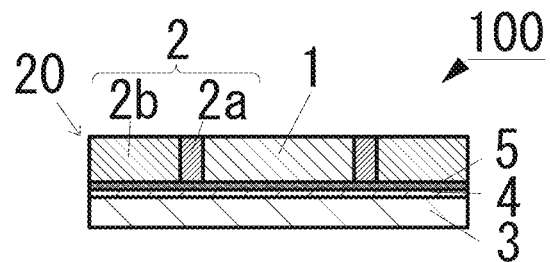
FIG. 9 is a view of the light emitting device combining the optical component related to the second embodiment and a light emitting element.
Figure 9:
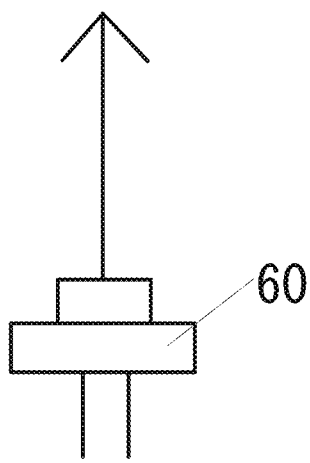

FIG. 9 is a schematic view of a light emitting device 100, which includes the optical component 20 related to the second embodiment and a light emitting element 60. The optical component 20 is essentially the same as that explained with reference to the optical component 10 except for the items described below.

The optical component 20 is equipped with an insulation film 5, a filter 4, and a heat dissipation member 3 on both the lower faces of the light transmissive member 1 and the light reflecting member 2, successively from the light transmissive member side in its thickness direction. The heat dissipation member 3 may be disposed on either the lower face of the light transmissive member 1 or the lower face of the light reflecting member 2, but is preferably disposed on both lower faces as shown in this embodiment, considering the heat dissipation performance.

A heat dissipation member can be disposed on at least one of the upper face of the light transmissive member 1 or the upper face of the light reflecting member 2, but the heat dissipation member 3 having light transmissivity is preferably disposed on at least one of the lower face of the light transmissive member 1 or the lower face of the light reflecting member 2 as in the case of this embodiment. When bonding the heat dissipation member 3 to the light transmissive member 1, the surface of the light transmissive member 1 is flattened by polishing or the like in some cases. Due to a polishing rate difference in such a case, the first region 2a of the light reflecting member 2 might be predominantly removed to thereby form a groove where the first region 2a is partially recessed.

Accordingly, if a heat dissipation member is provided on at least one of the upper face of the light transmissive member or the upper face of the light reflecting member, light can escape from such a groove of the first region in the upper part, which is the light extraction side to thereby reduce the luminance.

Accordingly, it is preferable to dispose the heat dissipation member 3 on at least one of the lower face of the light transmissive member 1 or the lower face of the light reflecting member 2 as in the case of this embodiment.

In the optical component 20, the heat generated at the light transmissive member 1 can be transferred to the heat dissipation member 3, thus degradation of the light transmissive member 1 can be attenuated.

In this embodiment, a material that readily transmits the light from the light emitting element 60 and readily reflects the fluorescent light from the light transmissive member 1, is employed as the filter 4. In this embodiment, a blue light emitting element is employed as the light emitting element 60, and a light transmissive material containing a phosphor that emits yellow light when irradiated with blue light, is used as the light transmissive member 1. Accordingly, the filter 4 employed is one that readily transmits blue light and readily reflects yellow light.

In this embodiment, the filter 4 is bonded to the lower face of the light transmissive member 1 and the lower face of the light reflecting member 2 via the insulation film 5. In this embodiment, in order to bond the filter 4 to the light transmissive member 1 and the like by surface activated bonding, the lower face of the light transmissive member 1 and the lower face of the light reflecting member 2 are polished.

At this time, due to the polishing rate difference between the light transmissive member 1 and the light reflecting member 2, grooves are formed near the borders between the light transmissive member 1 and the light reflecting member 2. Performing surface activated bonding with such grooves in place will create a gap between the light transmissive member 1 and the heat dissipation member 3, which will likely reduce the heat dissipation performance. Accordingly, such a decline in the heat dissipation performance is attenuated by filling the grooves with the insulation film 5.

In this embodiment, aluminum oxide is employed for the insulation film 5. For example, silicon oxide or titanium oxide can be used besides aluminum oxide. The insulation film 5 attenuates the heat dissipation decline, thus it is preferably formed to the thickness that can fill the grooves. Although surface activated bonding is used to bond the filter 4 and the light transmissive member 1 in this embodiment, atomic diffusion bonding may alternatively be employed. In this case, a metal film is formed on both the upper face of the filter and the lower face of the light transmissive member, and the filter and the light transmissive member are bonded by fusing the metal films together.

In the light emitting device 100 shown in FIG. 9, a laser element (i.e., laser diode or LD) is used for the light emitting element 60. The LD is spaced apart from the optical component 20 in such a manner as to transmit the light from the LD through the light transmissive member 1 of the optical component 20. The use of a phosphor ceramic containing a phosphor as the light transmissive member 1 and an LD as the light emitting element 60 increases the necessity to dissipate heat from the light transmissive member 1. This makes the effect of improved heat dissipation achieved by disposing a heat dissipation member 3 more significant.

Third Embodiment

Figure 10A:
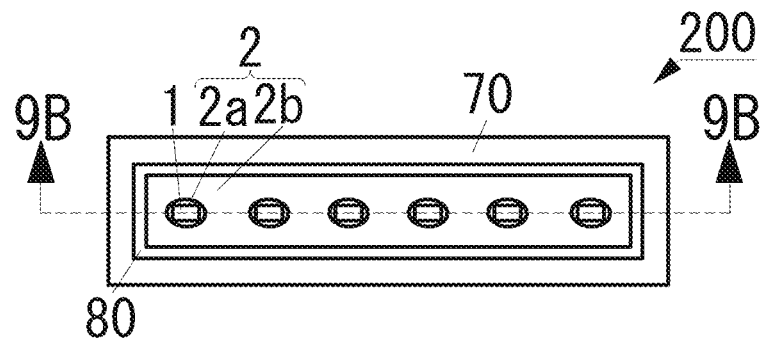
FIG. 10A is a top view of the light emitting device in which the optical component related to the third embodiment is combined with light emitting elements.
Figure 10B:
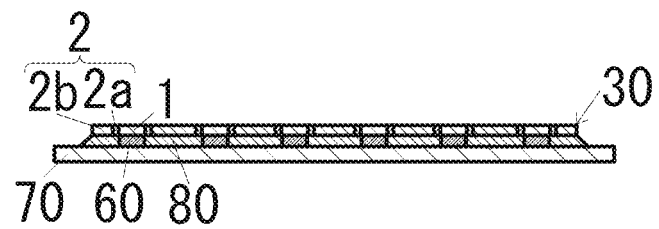
FIG. 10B is a cross-sectional view taken along line 10B-10B in FIG. 10A.

FIG. 10A is a top view of a light emitting device 200, which includes the optical component 30 related to the third embodiment and a light emitting element 60, and FIG. 10B is a cross-sectional view taken along line 10B-10B in FIG. 10A. The optical component 30 is essentially the same as one explained with reference to the optical component 10 except for the items described below.

The optical component 30 includes multiple light transmissive members 1. The light reflecting member 2 has a first region 2a on the periphery of each light transmissive member 1, and a second region 2b on the outside thereof.

In the light emitting device 200 shown in FIG. 10A and FIG. 10B, multiple light emitting elements 60 are disposed on the upper face of the substrate 70. In the light emitting device 200, light emitting diodes (LEDs) are employed for the light emitting elements 60.

A single optical component 30 is arranged on the upper faces of the light emitting elements 60 such that one light transmissive member 1 is positioned on the upper face of one light emitting element 60.

Moreover, a light reflecting resin 80 is arranged to surround the light emitting elements 60.

Although the light emitting device 200 is configured such that the light from one light emitting element 60 transmits through one light transmissive member 1, the optical component and the light emitting elements may be arranged such that the light from two or more light emitting elements transmits through one light transmissive member.

Example

An optical component was produced by the manufacturing method described below. First, for the light transmissive member 1, a rectangular parallelepiped phosphor ceramic having a short side of 500 μm in length, a long side of 1000 μm in length, and 600 μm in height was prepared. For the phosphor ceramic, one made of a sintered body that includes a YAG phosphor and aluminum oxide was employed.

Subsequently, the molded body 2d was formed by slip casting. Specifically, the molded body 2d was formed by the method described below. First, by placing and pressing the phosphor ceramic onto an acrylic-based resin sheet, the acrylic resin was transferred to the bottom face of the phosphor ceramic.

Then, the bottom face of the phosphor ceramic was temporarily secured on the upper face of plaster that is the support member 40 via the resin. Then, a frame 50 formed with a Teflon™ ring having an inner diameter of 30 mm was fixed onto the upper face of the support member 40 in such a manner as to surround the phosphor ceramic.

The frame 50 was filled with a slurry 2c until the upper face of the light transmissive member 1 was no longer visible. The slurry 2c contained 76.4% light reflecting powder, 0.7% dispersing agent, 2.4% binder, and 20.5% pure water.

The light reflecting powder contained 95.2 wt % aluminum oxide and 4.8 wt % yttrium oxide. The dispersing agent contained an ammonium polycarboxylate-based material, and the binder contained an acrylic material. The molded body 2d was formed by being left standing overnight to allow the plaster to absorb the moisture contained in the slurry 2c. In other words, a complex was formed in which the phosphor ceramic and the molded body 2d were formed into a certain shape.

Subsequently, after removing the frame 50, the complex was removed from the support member 40. At this time, although the bottom face of the phosphor ceramic has been temporarily secured to the plaster with an adhesive, it can be removed from the support member 40 because the lower face area of the phosphor ceramic is relatively small.

Then, the complex was degreased by heating at 700° C. for three hours in nitrogen ambience. Then, it was sintered at 1450° C. for two hours. Consequently, an optical component was obtained in which the phosphor ceramic and the light reflecting member 2 were integrated where the at least one lateral face and the upper face of the phosphor ceramic were covered with the light reflecting member 2. Subsequently, the optical component thus obtained was polished from the upper face side until the upper face of the phosphor ceramic was exposed. As a result, the optical component was obtained in which the phosphor ceramic was surrounded by the light reflecting member 2 when viewed from the top.

Figure 11:
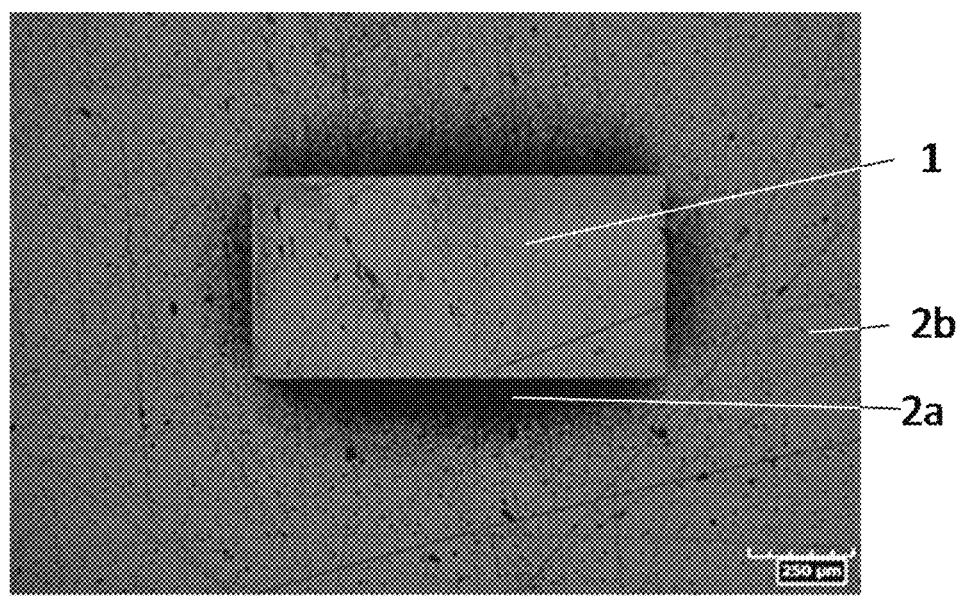
FIG. 11 is a photograph observing the optical component related to an example from the upper face side.

FIG. 11 is a photograph of the optical component captured from the upper face side in dark-field observation by using an incident light microscope. In FIG. 11, the rectangular member in the center is the light transmissive member 1 that is surrounded by the light reflecting member 2.

In the light reflecting member 2, the black portions are the first regions 2a, and the region on the outer side thereof is the second region 2b. As shown in FIG. 11, each first region 2a having high porosity appears black presumably attributable to a large number of shadows cast by the pores, while the second region 2b having low porosity appears colorless due to a small number of shadows.

The optical component described in the embodiments herein can be used for lighting fixtures, vehicular lighting devices, and the like.

What is claimed is:

1. A light emitting device comprising:
a light transmissive member having an upper face, a lower face, and at least one lateral face;
a light reflecting member that surrounds the at least one lateral face of the light transmissive member, the light reflecting member being made of a ceramic that contains a plurality of pores;
a heat dissipation member disposed under the light reflecting member and the light transmissive member, the heat dissipation member being made of a light transmitting material; and
a light emitting element disposed apart from the heat dissipation member in such a manner as to transmit light from the light emitting element through the heat dissipation member and the light transmissive member.

2. The light emitting device according to claim 1, wherein the light reflecting member is disposed in contact with the at least one lateral face of the light transmissive member.

3. The light emitting device according to claim 1, wherein the light transmissive member is made of a ceramic containing a phosphor, or a single crystal phosphor.

4. The light emitting device according to claim 3, wherein the light transmissive member is made of a phosphor ceramic containing a YAG-based phosphor, or a single crystal YAG-based phosphor.

5. The light emitting device according to claim 1, wherein the light reflecting member contains aluminum oxide.

6. The light emitting device according to claim 1, further comprising a filter disposed between the light transmissive member and the heat dissipation member, the filter being configured to transmit the light from the light emitting element, and to reflect light from the light transmissive member.

7. The light emitting device according to claim 6, further comprising an insulation film disposed between the light transmissive member and the filter.

8. The light emitting device according to claim 1, wherein the light emitting element is a laser diode.

9. The light emitting device according to claim 1, wherein the light transmissive member has a rectangular prism, a cylinder or a truncated cone.

10. The light emitting device according to claim 9, wherein the light transmissive member has a rectangular prism, and the upper face of the light transmissive member has a rectangle shape that is elongated in one direction.

11. The light emitting device according to claim 1, wherein an outer shape of the light reflecting member is a rectangular.

12. A light emitting device comprising:
a light transmissive member having an upper face, a lower face, and at least one lateral face;
a light reflecting member that surrounds the at least one lateral face of the light transmissive member, the light reflecting member being made of a ceramic that contains a plurality of pores;
a heat dissipation member disposed under the light reflecting member and the light transmissive member, the heat dissipation member having light transmissivity;
a light emitting element disposed apart from the heat dissipation member in such a manner as to transmit light from the light emitting element through the heat dissipation member and the light transmissive member;
a filter disposed between the light transmissive member and the heat dissipation member, the filter being configured to transmit the light from the light emitting element, and to reflect light from the light transmissive member; and
an insulation film disposed between the light transmissive member and the filter.

13. The light emitting device according to claim 12, wherein the light reflecting member is disposed in contact with the at least one lateral face of the light transmissive member.

14. The light emitting device according to claim 12, wherein the light transmissive member is made of a ceramic containing a phosphor, or a single crystal phosphor.

15. The light emitting device according to claim 14, wherein the light transmissive member is made of a phosphor ceramic containing a YAG-based phosphor, or a single crystal YAG-based phosphor.

16. The light emitting device according to claim 12, wherein the light reflecting member contains aluminum oxide.

17. The light emitting device according to claim 12, wherein the light emitting element is a laser diode.

18. The light emitting device according to claim 12, wherein the light transmissive member has a rectangular prism, a cylinder or a truncated cone.

19. The light emitting device according to claim 18, wherein the light transmissive member has a rectangular prism, and the upper face of the light transmissive member has a rectangle shape that is elongated in one direction.

20. The light emitting device according to claim 12, wherein an outer shape of the light reflecting member is a rectangular.

* * * * *